United States Patent
Mukhopadhyay et al.

(10) Patent No.: US 7,333,419 B2
(45) Date of Patent: Feb. 19, 2008

(54) METHOD TO IMPROVE PERFORMANCE AND REDUCE COMPLEXITY OF TURBO DECODER

(75) Inventors: Tathagato Mukhopadhyay, West Bengal (IN); Navneet Malpani, Bangalore (IN)

(73) Assignee: Sasken Communication Technologies, Inc. (IN)

( * ) Notice: Subject to any disclaimer, the term of this patent is extended or adjusted under 35 U.S.C. 154(b) by 870 days.

(21) Appl. No.: 09/997,774

(22) Filed: Nov. 30, 2001

(65) Prior Publication Data

US 2002/0122423 A1 Sep. 5, 2002

Related U.S. Application Data

(60) Provisional application No. 60/250,201, filed on Nov. 30, 2000.

(51) Int. Cl.
*H04J 11/00* (2006.01)
(52) U.S. Cl. .............. 370/203; 375/240.26; 375/262; 375/265; 375/341
(58) Field of Classification Search .......... 370/391, 370/394, 395.65, 468, 474, 203; 375/262, 375/265, 341, 240.26, 240.28
See application file for complete search history.

(56) References Cited

U.S. PATENT DOCUMENTS

| | | | |
|---|---|---|---|
| 5,796,757 A * | 8/1998 | Czaja ......................... 714/789 |
| 6,108,372 A * | 8/2000 | Tidemann et al. .......... 375/225 |
| 6,182,261 B1 * | 1/2001 | Haller et al. ................ 714/758 |
| 6,212,233 B1 * | 4/2001 | Alexandre et al. ..... 375/240.03 |
| 6,292,918 B1 * | 9/2001 | Sindhushayana et al. ... 714/755 |
| 6,392,572 B1 * | 5/2002 | Shiu et al. .................... 341/81 |
| 6,393,074 B1 * | 5/2002 | Mandyam et al. .......... 375/341 |
| 6,526,531 B1 * | 2/2003 | Wang ........................ 714/704 |
| 6,662,331 B1 * | 12/2003 | Kang ......................... 714/755 |
| 6,675,342 B1 * | 1/2004 | Yagyu ........................ 714/755 |
| 6,725,054 B1 * | 4/2004 | Hwang et al. .............. 455/522 |

* cited by examiner

*Primary Examiner*—Chi Pham
*Assistant Examiner*—Albert T. Chou
(74) *Attorney, Agent, or Firm*—Welsh & Katz, Ltd.

(57) ABSTRACT

One aspect of the invention relates to a method and embodiment for decoding a sequence of frames in a communication system having a predetermined decoding time constraint per frame. The first frame of a sequence of frames is decoded for a time period longer than the predetermined time constraint, and at least one other frame of the sequence of frames is decoded in a time period less than the predetermined time constraint. Thus, an average decoding time of all decoded frames is less than or equal to the predetermined time constraint.

29 Claims, 15 Drawing Sheets

METHOD TO IMPROVE PERFORMANCE AND REDUCE COMPLEXITY OF TURBO DECODER

CROSS REFERENCE TO RELATED APPLICATION

This application claims the benefit U.S. Provisional Application Ser. No. 60/250,201, filed Nov. 30, 2000.

BACKGROUND OF THE INVENTION

The invention relates to iterative decoding methods and iterative decoders. In particular, the invention relates to iterative decoding methods and iterative decoders used in conjunction with communication systems.

Iterative decoding schemes are well known in the art. Typically, these decoding schemes are used in receivers to decode encoded data that is transmitted across a channel from a transmitter to a receiver. One type of iterative decoding scheme is known as turbo decoding, which performs several iterations on each frame of received data until the data is properly decoded.

Several systems incorporate turbo decoders, such as, for example 3rd generation wireless communication systems and satellite communication systems.

For example, the channel coding scheme used in $3^{rd}$ generation wireless systems is the PCCC (Parallel Concatenated Convolution Code) turbo code. The decoding algorithm is an iterative decoding algorithm. The PCCC turbo encoder structure as specified by 3GPP ($3^{rd}$ Generation Partnership Project) for the W-CDMA $3^{rd}$ generation wireless systems is as shown below.

The transfer function of the 8-state constituent code for PCCC is $$G(D) = \left[1, \frac{n(D)}{d(D)}\right]$$

where, $d(D)=1+D^2+D^3$ $n(D)=1+D+D^3$.

The initial value of the PCCC encoder shift registers are zeros. The output of the PCCC encoder is punctured to produce coded bits corresponding to the desired code rate, ⅓. For a ⅓ code rate, none of the systematic or parity bits are punctured, and the output sequence is X(0), Y(0), Y'(0), X(1), Y(1), Y'(1), etc. Trellis termination is performed by taking the tail bits from the shift register feedback after all the information bits are encoded. Tail bits are added after the encoding of information bits. The first three tail bits shall be used to terminate the first constituent encoder (upper switch of FIG. 1 in a lower position) while the second constituent encoder is disabled. The last three tail bits shall be used to terminate the second constituent encoder (lower switch of FIG. 1 in a lower position) while the first constituent encoder is disabled. The transmitted bits for trellis termination shall then be X(t) Y(t) X(t+1) Y(t+1) X(t+2) Y(t+2) X'(t) Y'(t) X'(t+1) Y'(t+1) X'(t+2)Y'(t+2).

The Turbo code internal interleaver can be the PIL interleaver. The two most common decoding algorithms are the maximum a posteriori (MAP) algorithm and the soft output Viterbi algorithm (SOVA). The MAP algorithm gives the best performance but the SOVA algorithm provides reduced complexity. There are two forms of MAP algorithms in use for decoding the PCCC. These are the Bahl, Cocke, Jelenik and Raviv (BCJR) algorithm and the soft input soft output (SISO) algorithm. The SISO algorithm is essentially the same as the BCJR algorithm but has a more elegant form and has greater flexibility. A block diagram of the PCCC decoder is shown in FIG. 2.

The basic unit of the algorithm is the SISO module. The SISO module is a four port device that has two inputs and two outputs and which module implements the SISO algorithm. The module's inputs are the probabilities of the information symbols P(u; I) and code symbols P(c; I) labeling the edges of the code trellis, and the outputs are updates of these probabilities based upon knowledge of the trellis, P(u; O) and P(c; O), respectively.

FIG. 2 shows the use of the SISO module in a PCCC decoder. The inputs to the first SISO module are the probabilities of the code symbols and information symbols for the first code. The code symbol probabilities are similar to the branch metrics used in a Viterbi decoder and are determined from the demodulated signal amplitude and an estimate of the noise variance. The information symbol probabilities for the first code are the de-interleaved updated information symbol probabilities of the second code from the previous iteration (during the first iteration nothing is known about these probabilities, so the a priori distribution should be used).

Only the updated probabilities of the information symbols of the first code are used while the updated code symbol probabilities are ignored. The updated probabilities of the first code's information symbols are interleaved and become the input to the second SISO module, along with the second code's code symbol probabilities, again determined from the output of the demodulator and an estimate of the noise variance (note that only the parity bits from the second encoder are transmitted, so the probability of the punctured systematic bits are all 0:5). Again, the code symbol output is not used, and the probabilities of the information symbols from the second code are de-interleaved to become the input to the first SISO module during the next iteration.

After all iterations are complete, the probabilities of the information symbols from both codes can be combined by multiplying the probabilities. A final decision can then be made by choosing the information symbols with the highest probabilities.

The known decoders have several drawbacks. For instance, the performance of turbo decoders improve considerably as the number of iterations increase but the time taken for decoding also increases as the number of iterations increase. In particular, the time constraints for decoding (decoding time constraint per frame) in the W-CDMA system necessitates that the number of iterations that the system can perform within the given time constraints be optimized to the fullest. Typically, the system's decoding time constraint per frame is limited by the system's transmission and reception rate of frames so that the decoding time per frame does not exceed the transmission time per frame.

Although some decoders have addressed these concerns by fixing the number of iterations, such a solution can have drawbacks. A slow decoder may not be able to support the number of iterations required to achieve a particular performance level. A faster decoder, on the other hand, may be able to support a particular performance level, but the faster decoder will also perform a number of redundant iterations because each frame may not require the same number of iterations to achieve the same performance.

For example, if a performance level requires 12 iterations to be performed for a frame length of 1280, a decoder which can only support 3 iterations within the time constraint for that frame length will severely degrade performance.

SUMMARY OF INVENTION

Pursuant to a first aspect of the invention, in order to make the number of iterations per frame variable, the use of an error detection check along with an iterative decoder may be used. In one method and embodiment, the error detection check can be performed after every iteration, in others, it may be repeatedly performed after a predetermined number of iterations. The error detection check enables a user to determine how many iterations are required for incoming frames and, consequently, allows the user to determine when to stop the iterative decoding process at the receiver. One error detection check that may be employed is the Cyclic Redundancy Check (CRC).

Pursuant to the first aspect of the invention, incoming frames can be stored (or buffered) when the decoder is busy processing an earlier frame. Thus, methods and embodiments of the first aspect of the invention allow for decoding of frames that require decoding for a period longer than the system's decoding time constraint per frame. At least one other frame will be subsequently decoded in a period shorter than the decoding time constraint. Therefore, pursuant to methods and embodiments of the invention, the average decoding time period per frame will be less than or equal to the system's decoding time constraint per frame.

Pursuant to a second aspect of the invention, an optimal storage device size or buffer length to be used in embodiments and methods incorporating the first aspect of the invention is determined. The optimal storage device size or buffer length reduces buffer or storage device frame overflow.

Pursuant to a third aspect of the invention, an alternate storage device or alternate buffer can be used to store frames that still have errors after a predetermined number of decoding iterations have been performed on them. Such partially decoded frames are decoded out of sequence at a subsequent time. The frames are then resequenced pursuant to the third aspect of the invention.

Pursuant to a fourth aspect of the invention, the decoded frames can be retrieved by an upper layer at a constant rate, or pursuant to any process or scheme whose average rate is equal to or less than the rate frames are decoded, even though the decoder decodes the frames at a variable rate. Pursuant to the fourth aspect, sufficiently decoded frames, that, for example, are substantially converged, can be stored in an output storage device or output buffer, and later sent to an upper layer.

DETAILED DESCRIPTION OF THE INVENTION

Figure 1:
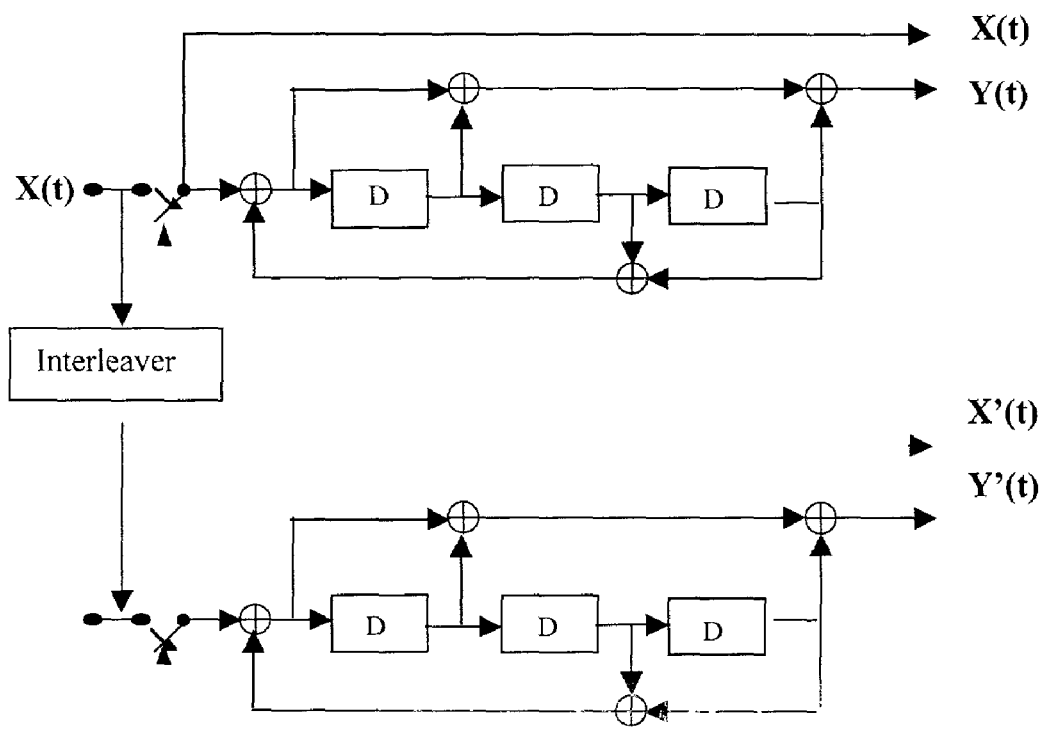
FIG. 1 depicts a block diagram of a 3G PCCC encoder.
Figure 2:
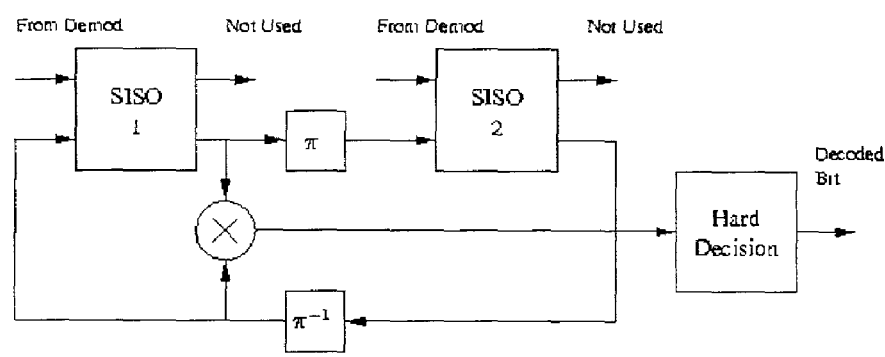
FIG. 2 depicts a block diagram of a PCCC decoder that uses an SISO module.

While the present invention is susceptible of use in various embodiments, it is shown in the drawings and will hereinafter be described several embodiments with the understanding that the present disclosure is to be considered an exemplification of the invention and is not intended to limit the invention to the embodiments illustrated.

A first aspect of the invention is directed to a method and apparatus for decoding a sequence of frames in a communication system having a predetermined decoding time constraint per frame (e.g. the transmission frame rate of an associated communication system). Pursuant to the first aspect of the invention, a first frame of the sequence of frames is decoded in a time period longer than the predetermined time constraint, and at least one other frame of the sequence of frames is decoded in a time period less than the predetermined time constraint. This allows for an average decoding time of all decoded frames in a period to be less than or equal to the predetermined time constraint of the system.

Note that all aspects of the invention may be used wherever iterative codes, such as, turbo codes for example, are used. For better error protection, these iterative codes are typically used as channel coding or decoding schemes in communication systems, particularly wireless or satellite communication systems. The invention is particularly useful in situations in which the computational complexity required to obtain optimal performance is beyond system capabilities due to speed constraints of the processor of the decoder. The invention allows the system to obtain the same performance level with a much lower average complexity and a nominal storage or buffer requirement. 3rd Generation wireless systems is but one example of the situations described above.

Although several figures and results that show how the invention performs when simulated under AWGN channel conditions are shown, it is contemplated that the invention may be used in conjunction with a variety of different types of channels used in various systems not depicted.

Figure 3:
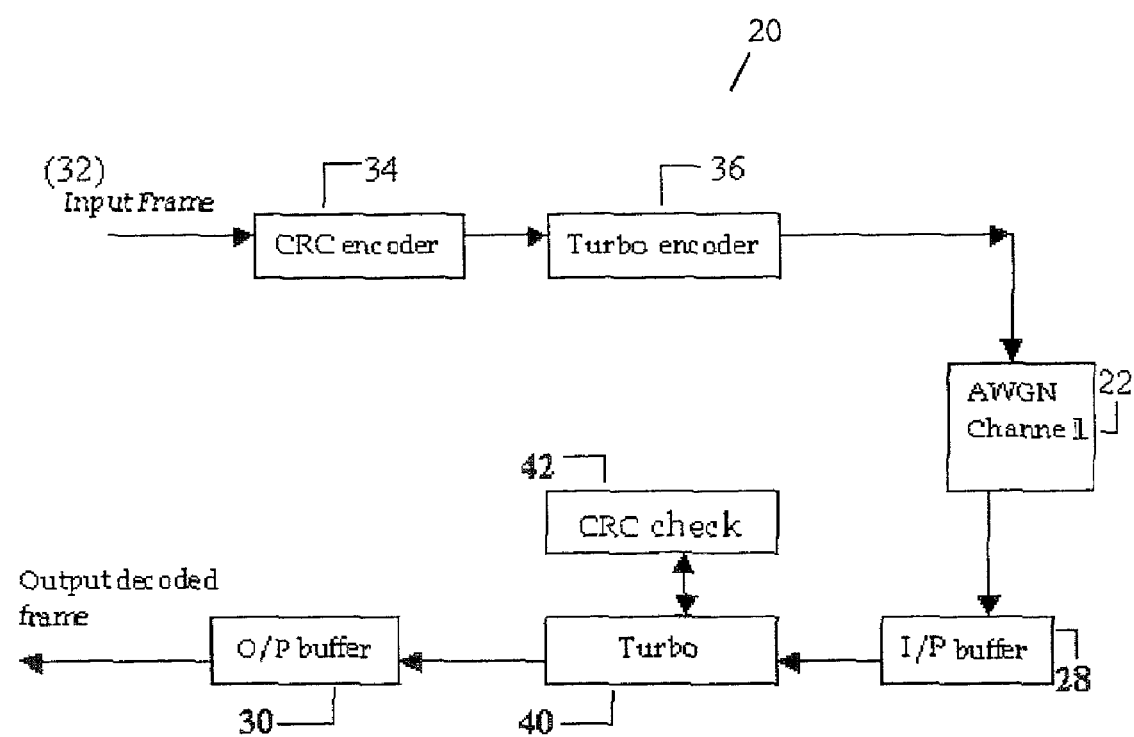
FIG. 3 depicts an overall system for an AWGN channel, and one configuration of receiver components pursuant to aspects of the invention.
Figure 4:
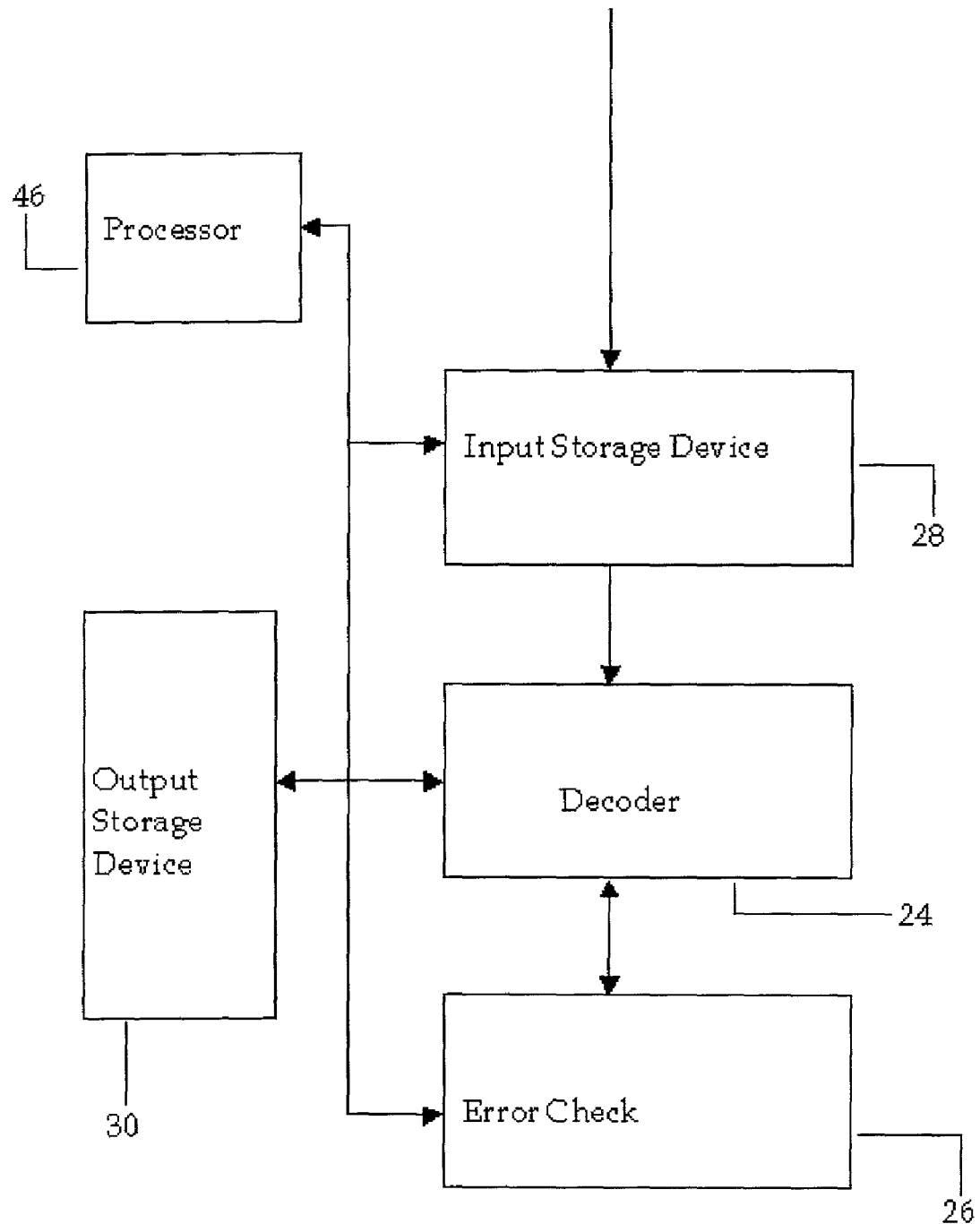
FIG. 4 depicts an alternate configuration of receiver components of FIG. 3 pursuant to aspects of the invention.

The overall communication system 20 including an AWGN channel 22 is shown in FIG. 3, and FIG. 4 shows an alternate configuration of the receiver components shown in FIG. 3. For example, FIG. 4 shows a decoder 24, error check 26, input storage device 28, and output storage device 30.

Figure 5:
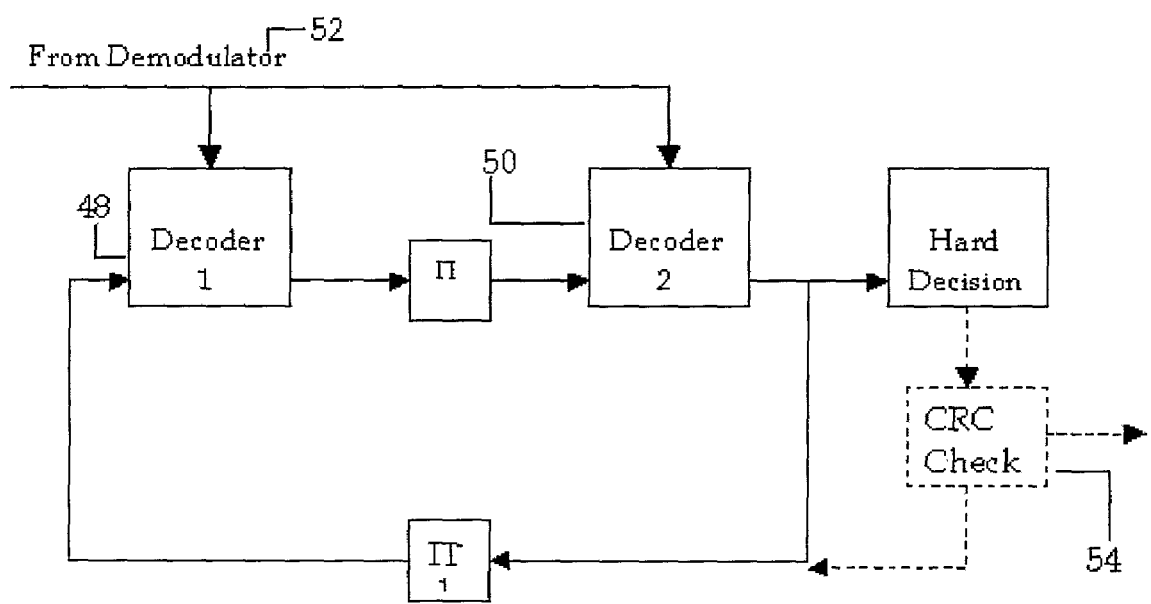
FIG. 5 depicts a block diagram of a turbo decoder of FIG. 3 along with a CRC check.

FIG. 3 shows an input frame 32 forwarded to a Cyclic Redundancy Check encoder 34 and a turbo encoder 36. The encoded frame is then transmitted across a channel, a AWGN channel 22 in FIG. 3, and into a receiver (not shown). Portions of the receiver pertinent to the invention are shown, such as the input buffer 28, a turbo decoder 40 (a block diagram of which is shown in FIG. 5), an error check 42, and an output buffer 30. As those skilled in the art will appreciate, the turbo decoder 40 and error check 42 of FIG. 3 each have a separate processor (not shown). The frame is decoded pursuant to aspects of the invention as described below, and the decoded frame is then forwarded.

Alternate embodiments of the pertinent portions of the receiver may be structured as shown in FIG. 4. FIG. 4 shows a processor 46, which can be for example a microprocessor, which functions as the controller for the error check 26 and the decoder 24 and storage devices 28, 30.

The performance of iterative and turbo decoders improve as the number of iterations increase, however, the computational complexity also increases almost linearly with the number of iterations. This can cause problems in decoders that have slow decoding or processing capabilities.

The number of iterations that the turbo decoder requires to converge varies from frame to frame for a typical channel. Once convergence is reached, the hard decision output of the turbo decoder will not change. If the maximum number of iterations for convergence is fixed (N) per frame, the convergence for certain frames that don't require N iterations for convergence would be reached within a fewer number of iterations (F). Therefore, (N–F) redundant iterations would have to be performed. For other frames, F iterations might be insufficient for convergence to be reached.

Pursuant to the first aspect of the inventions, the problems discussed above can be solved by varying the number of iterations per frame. In order to determine when convergence for the frame is reached, an error detection code can be implemented along with the turbo decoder. It is contemplated that any error detection check that works with a bit stream, or a linear block code that has error detection capabilities may be used. FIG. 5 shows a block diagram having two decoder blocks 48, 50. The first decoder block 48 is shown receiving frames from the demodulator 52 of the receiver (not shown), and an error detection check 54 is shown. One example of an acceptable error detection check 54 is a Cyclic Redundancy Check (CRC) check. If the error detection check 54 does not detect errors, the frame is forwarded, otherwise the frame is sent back to the decoder blocks 48, 50 for further decoding.

Pursuant to the first aspect of the invention, the error detection check 26, 42 can be used after each decoding iteration has been performed. Alternatively, the error detection check 26, 42 may be used after a predetermined number of iterations has been performed. The error detection check 26, 42 is used to determine if there are any errors in the frame being decoded. If no errors are detected, then iterative decoding for that frame can be stopped, thus saving time and processing power by preventing unnecessary decoding iterations.

Figure 6:
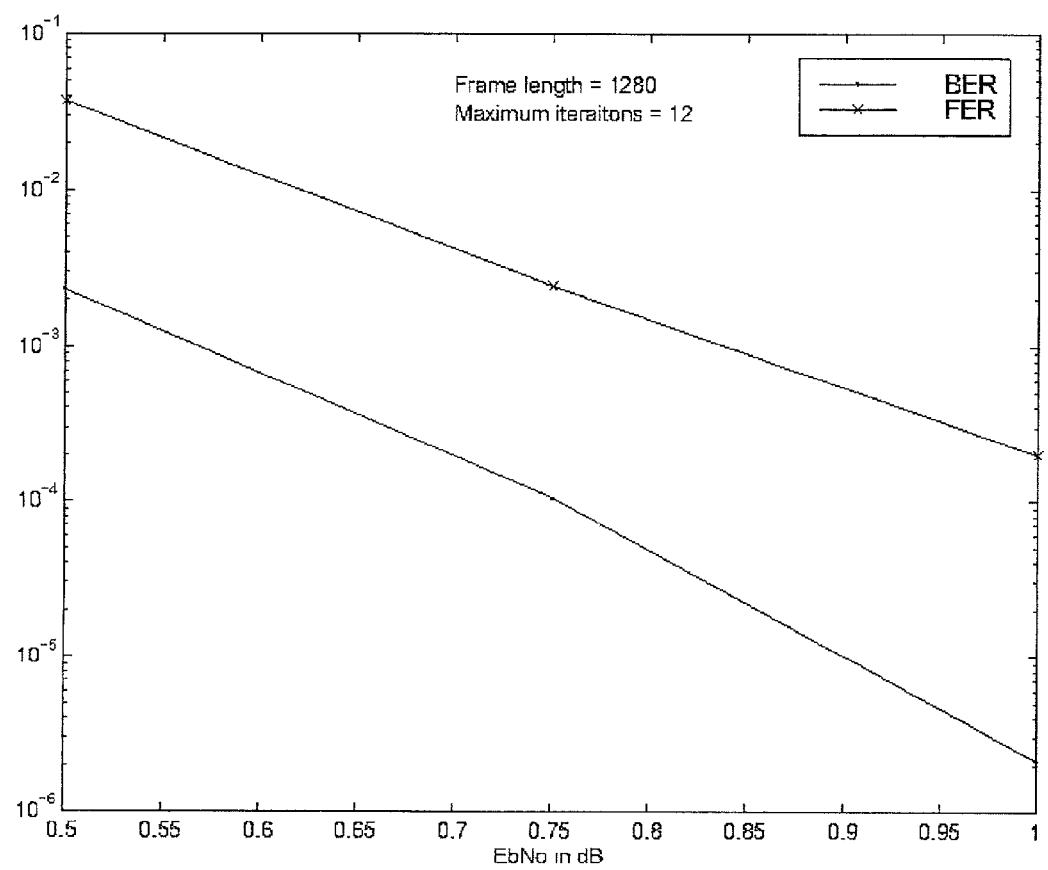
FIG. 6 depicts a BER versus FER plot that may be provided by the system of FIG. 3 for a frame length of 1280 bits after performing 12 iterations for each frame.
Figure 7:
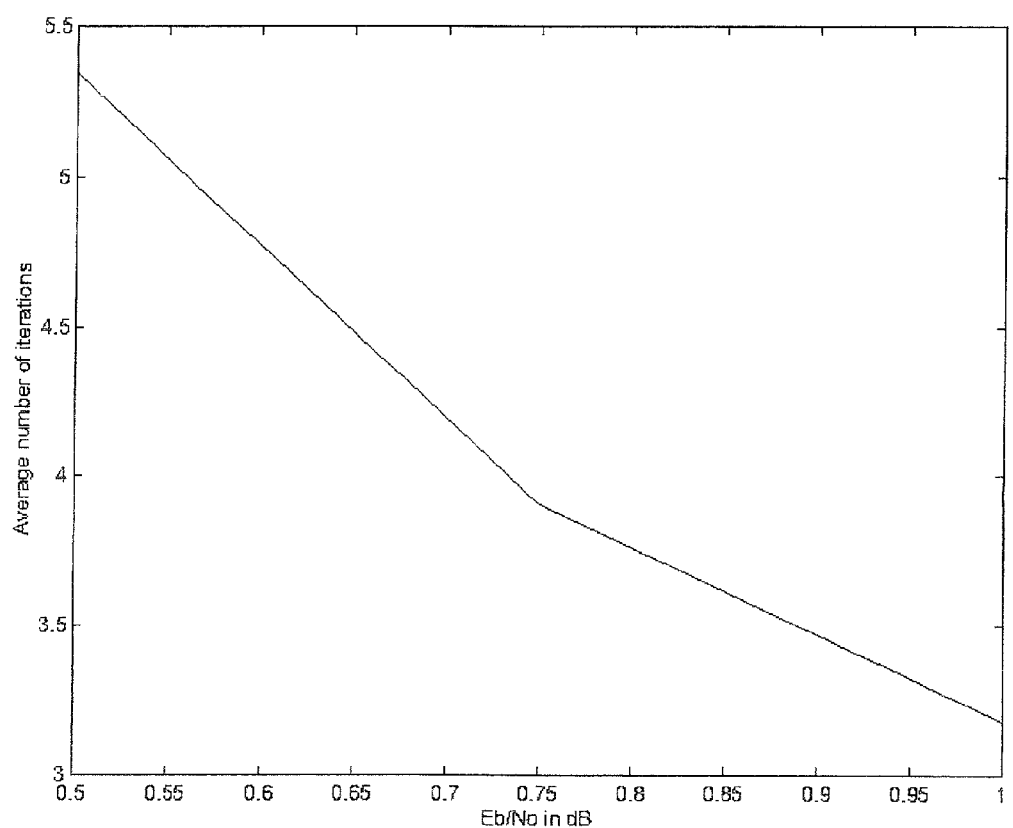
FIG. 7 shows the average number of iterations that are required to achieve the performance describe in FIG. 6.

For example, FIG. 6 shows the plot of a BER (Bit Error Rate) and a FER (Frame Error Rate) for a frame length of 1280 bits after performing 12 iterations for each frame. The same performance, in terms of BER and FER, can be achieved with a lower average number of iterations. FIG. 7 shows the average number of iterations required to achieve the same performance. Thus, if an error detection check 26, 42, such as, for example, a CRC, is used, after each iteration or after a predetermined number of iterations, the complexity and power consumption of the decoder can be reduced. Consequently, the decoding speed may be increased by performing only the minimum number of decoding iterations required for substantial convergence on each frame as opposed to performing unnecessary iterations for frames that don't require the full 12 iterations.

Figure 8:
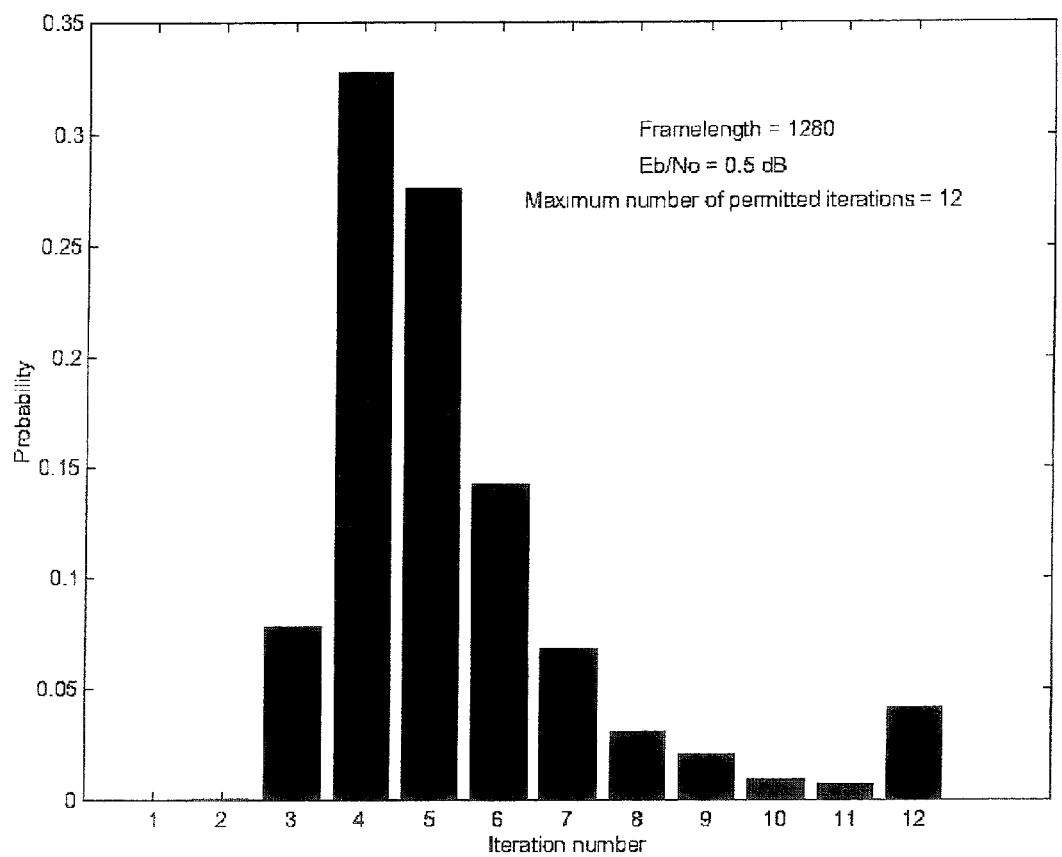
FIG. 8 shows the simulation results of the number of iterations taken by the system of FIG. 3 for frames of length 1280 bits and for a 0.5 dB Eb/No value.
Figure 9:
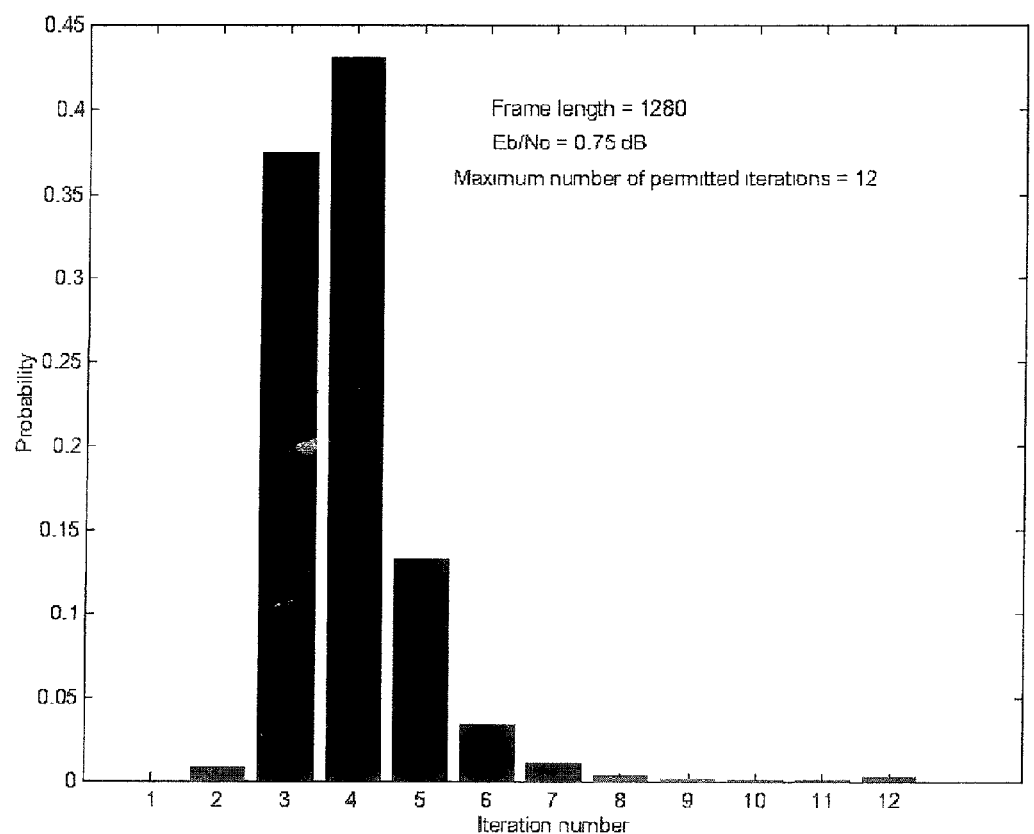
FIG. 9 shows the simulation results of the number of iterations taken by the system of FIG. 3 for frames of length 1280 bits and for a 0.75 dB Eb/No value.
Figure 10:
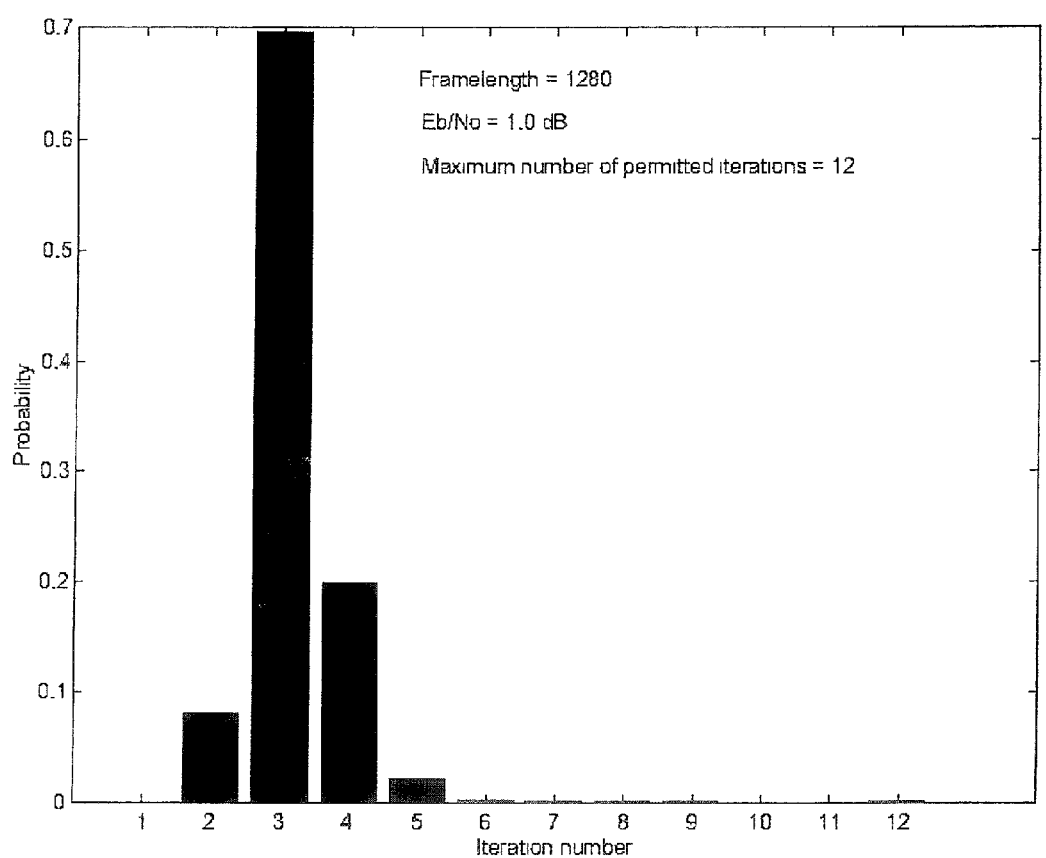
FIG. 10 shows the simulation results of the number of iterations taken by the system of FIG. 3 for frames of length 1280 bits and for a 1.0 dB Eb/No value.

Another problem can arise if the decoder cannot perform enough iterations for substantial convergence within the system's decoding time constraint per frame, which can be, for example, a frame duration (10 ms). The simulation results of the number of iterations required for frames of length 1280 bits for Eb/No values of 0.5, 0.75, and 1.0 dB are shown in FIGS. 8-10, respectively. It is apparent that the number of iterations required for certain frames is greater than the average number of iterations (the number of iterations required for the average frame), and that the number of iterations required for other frames is less than the number required for the average frame.

For systems having decoding time constraints per frame, it may not be possible for the decoder to decode a frame that requires a greater number of iterations than the average frame within the time constraint, while other frames, which require less than the average number of iterations, could be decoded well within the time constraint. This can particularly apply to 3G systems because of the time constraints they are subject to.

If a system is subject to a time constraint for decoding a frame, and thus limited to a maximum number of iterations it can perform for each frame based on the time constraint and the decoder's processing speed, the BER and FER performance of the decoder may degrade. For example, if a decoder is subject to a one frame time constraint of, for example 10 ms, and the decoder is only capable of computing 4 iterations every 10 ms, the maximum number of iterations is also fixed at 4. This can cause significant degradation in FER and BER performance. To illustrate, because of the 10 ms time constraint and the decoder's 4 iterations/10 ms processing speed, the decoder could only perform 4 iterations for corrupted frames that may require, for example, 6 iterations for substantial convergence. If only 4 iterations are performed for a corrupted frame that requires 6 iterations, a greater FER and BER could result.

Figure 11:
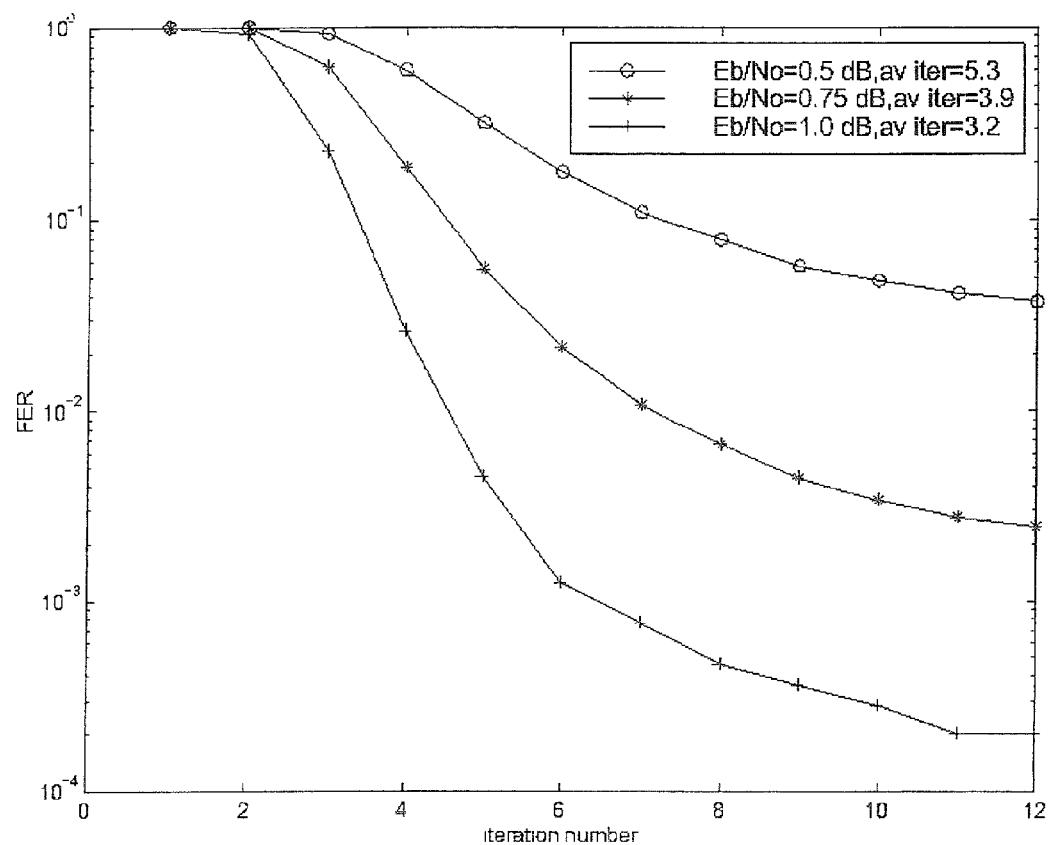
FIG. 11 depicts a graph that plots FER as a function of the number of iterations performed by the system of FIG. 3.

FIG. 11 shows FER as a function of the number of iterations, and shows that, for Eb/No value of 0.75 dB, the FER after 4 iterations is around 0.1 whereas it is about 0.002 after 12 iterations.

Pursuant to the first aspect of the invention, frames received from the channel can be stored or buffered, resulting in improved FER and BER performance. To illustrate, if a decoder is capable of computing 4 iterations per frame duration, from FIG. 9, one can see that the average number of iterations for an Eb/No value of 0.75 dB is around 4 and the FER without storing or buffering is about 0.1 (from FIG. 11). If input storage devices or input buffers are used, one can see that an FER of about 0.002 for the same Eb/No value can be achieved while maintaining the average decoding time well within the frame duration time constraint. As discussed below, output storage devices or output buffers 30 could also be used to facilitate the specific requirements of upper layers that subsequently process the decoded frames.

The increase in performance occurs because only the necessary number of iterations are performed for each frame to reach substantial convergence, and a storage device or buffer 28 is used to store other frames when the decoder 24, 40 is busy decoding a frame that requires "extra time" to decode ("extra time" refers to any time period that is greater than the system's decoding time constraint per frame). For example, if the maximum number of iterations is increased and a buffer 28 is incorporated, a subsequent frame may be stored in the buffer while the decoder 24, 40 spends extra time to decode a corrupted frame. After the requisite number of iterations is performed on the corrupted frame, the decoder 24, 40 may proceed to decode the next frame, which may be uncorrupted or average.

For systems having a decoding time constraint per frame of, for example, 10 ms, if the maximum number of iterations was increased and fixed beyond the number of iterations the decoder could perform in 10 ms, each subsequent frame would be dropped if a storage device or buffer was not used. If the maximum number of iterations was fixed and the number of iterations was variable, on the other hand, subsequent frames would be dropped when the decoder performed extra iterations for corrupted frames that required more than 10 ms to decode.

Pursuant to methods and embodiments incorporating the first aspect of the invention, as shown in FIGS. 3 and 4, an error check 26, 42 and an input storage device or input buffer 28 can be used with an iterative decoder 24, 40 to produce beneficial results. In the first embodiment and method, a corrupted frame that requires, for example, 6 iterations, may be decoded in 15 ms by a decoder 24, 40 that has a processing speed of 4 iterations/10 ms. If the system was subject to a decoding time constraint of, for example 10 ms, a subsequent frame, which could be uncorrupted and require only 2 iterations, could be stored or buffered in the storage device or buffer 28 while the decoder 24, 40 is busy decoding the corrupted frame. The decoder 24, 40 could then retrieve and process the uncorrupted frame from the storage device or buffer 28 in 5 ms after decoding the corrupted frame. Consequently, the average decoding time per frame would meet the 10 ms decoding time constraint per frame while achieving optimal BER and FER performance. In the embodiments shown in FIGS. 3 and 4, the error or convergence check 26, 42 allows for a variable iterative decoder 24, 40 while an input storage device or buffer 28 prevents subsequent frames from being dropped while the decoder is busy decoding corrupted frames that require more than 10 ms (i.e., "extra time") for decoding. In other embodiments not shown, a storage device or buffer may be used with or without an error check.

It should be noted that, for the embodiment shown in FIG. 3, the processor (not shown) of the error check 42 performs the error checks and indicates when a frame is to be sent from the error check 42 to the decoder 40. The processor (not shown) of the decoder 40 performs the decoding iterations and indicates when to retrieve frames from the input storage device or input buffer 28 and begin decoding them, when to send frames that have had decoding iterations performed on them to either the error check 42 or the output buffer 30, and also indicates when the output buffer is to output frames to an upper layer (not shown).

It should also be noted that, for the embodiment shown in FIG. 4, the processor 46 is what commands the transfer of frames from one block to another (for example, from the input buffer 28 to the decoder 24), and performs the decoding operations and convergence checks.

A first variation of methods and embodiments incorporating the first aspect of the invention can include an upper limit for the number of iterations. From inspecting FIG. 11, one can see that the average number of frames that can be corrected beyond a certain number of iterations decreases considerably as the number of iterations increases. Consequently, pursuant to the first variation, the upper limit should be fixed based on the timing of the turbo decoder as well as the overall performance of the system. For all the simulation results given, the upper limit was 12. The input and output storage devices or buffers of the turbo decoders can be implemented as a FIFO queue. For a certain maximum number of permitted iterations, as well as for a particular Eb/No value and framelength, a statistic of the average number of iterations taken by frames can be determined.

If the decoder can compute the average number of iterations within the system's decoding time constraint per frame (for example, 10 ms), the average service rate will be equal to or greater than the arrival rate of frames, and thus the input queue would reach a steady state and follow Little's theorem. In this case, the average output rate from the decoder will be equal to the average arrival rate in the input queue.

Figure 12:
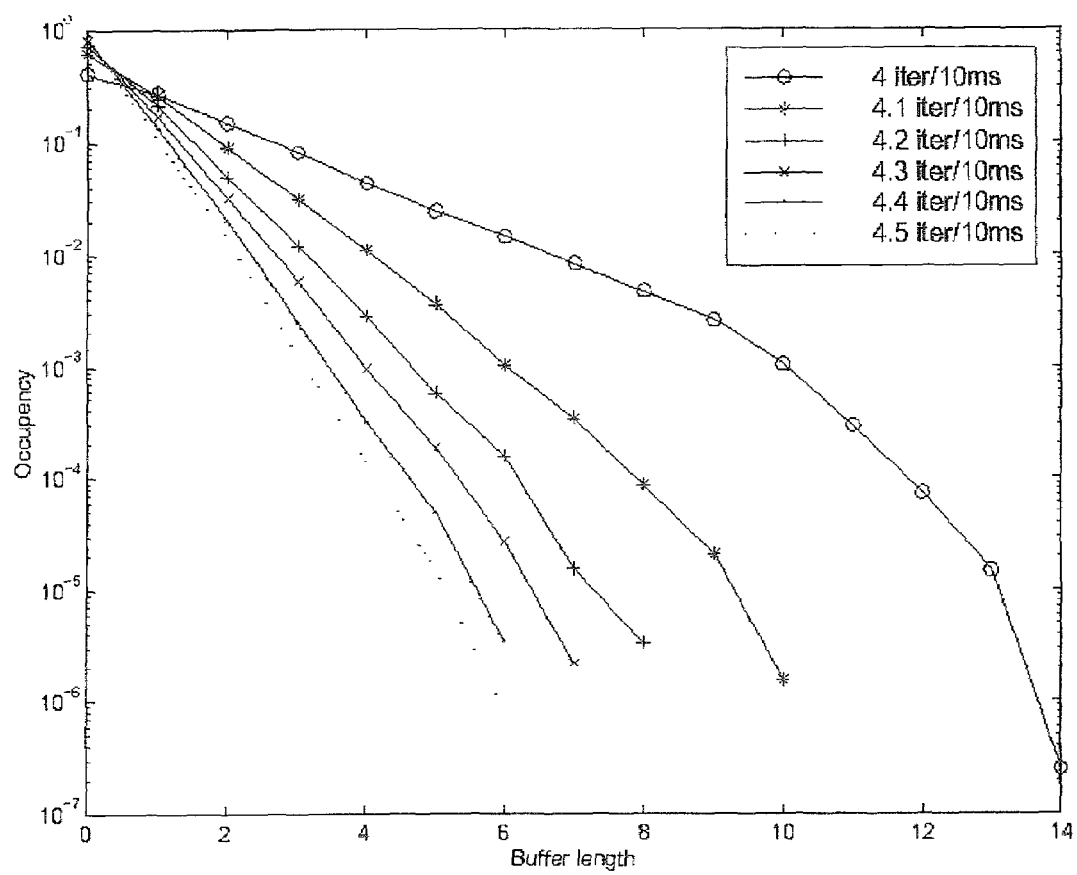
FIG. 12 shows a plot of the input buffer occupancy given a turbo decoder of the system of FIG. 3 that is capable of performing 4-4.5 iterations for a frame length of 1280 bits within 10 ms.

If the upper layer reads frames from an output storage device or buffer at the same rate as arrival, the output queue will also reach a steady state. If the decoder speed is increased, the occupancy of input and output storage devices or buffers will change. FIG. 12 shows a plot of the input storage device or buffer occupancy given for a turbo decoder capable of performing 4-4.5 iterations for a frame length of 1280 bits within 10 ms. The Eb/No value is 0.75 db, and the average number of iterations required is 3.9. From this figure the size of the required buffer can be estimated. Note that pursuant to other aspects of the invention, output storage devices or output buffers are used in conjunction with the decoder to facilitate specific requirements that upper layers might have.

In sum, pursuant to the first aspect of the invention, the average time to decode all frames is less than or equal to the decoding time constraint per frame. This is done by increasing the number of decoding iterations for frames that require a greater number of decoding iterations for substantial convergence. The error check determines whether there are errors in the frames, and if there are, additional decoding iterations should be performed on those frames. In the meanwhile, while additional iterations are performed on those frames requiring a greater number of decoding iterations, other frames are stored or buffered for subsequent decoding.

Pursuant to a second aspect of the invention, the buffer or storage device size limit is determined so that the probability of storage device or buffer overflow is within an acceptable limit. Storage device or buffer overflow occurs when the number of frames stored or buffered in the storage device or buffer exceed the buffer size limit, in which case frames that cause the buffer to exceed the buffer size limit are dropped.

One example of a way to determine an acceptable storage device or buffer size limit is described below. The storage device or buffer size limit may be premised on various parameters and constraints, such as, for example, storage device or buffer overflow or memory constraints.

In this example, the storage device or buffer size limit is based on the probability of storage device or buffer overflow. For example, let $F_b$ be the FER due to buffer overflow and $F_e$ be the FER due to error and $F_t=F_b+F_e$, where $F_e$ is known. Let $F_b<F_e/$(precision factor) and L be the buffer length to be fixed. Then find L to satisfy the equation listed below.

$$Fb=1-\Sigma_{i=0 \text{ to } L}Pr(b=i)$$

Figure 13:
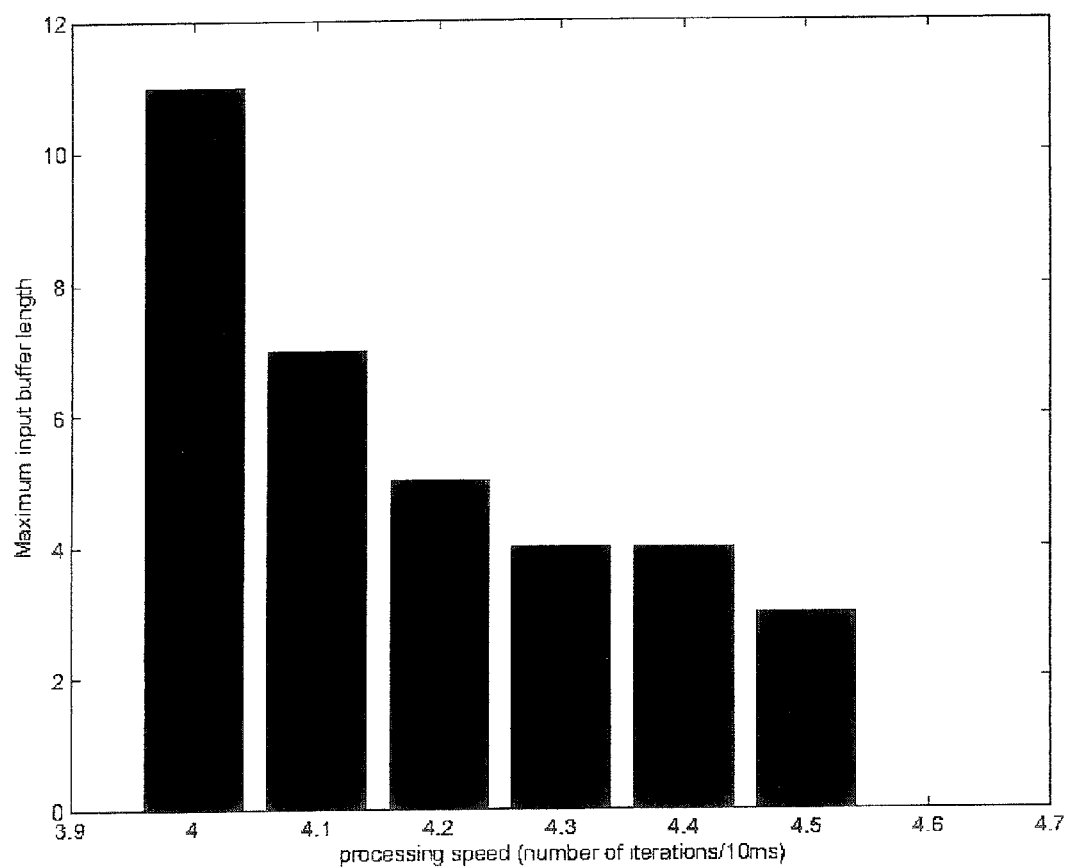
FIG. 13 shows the maximum buffer length required for the same Fb at different processing speeds of the system of FIG. 3.
Figure 14:
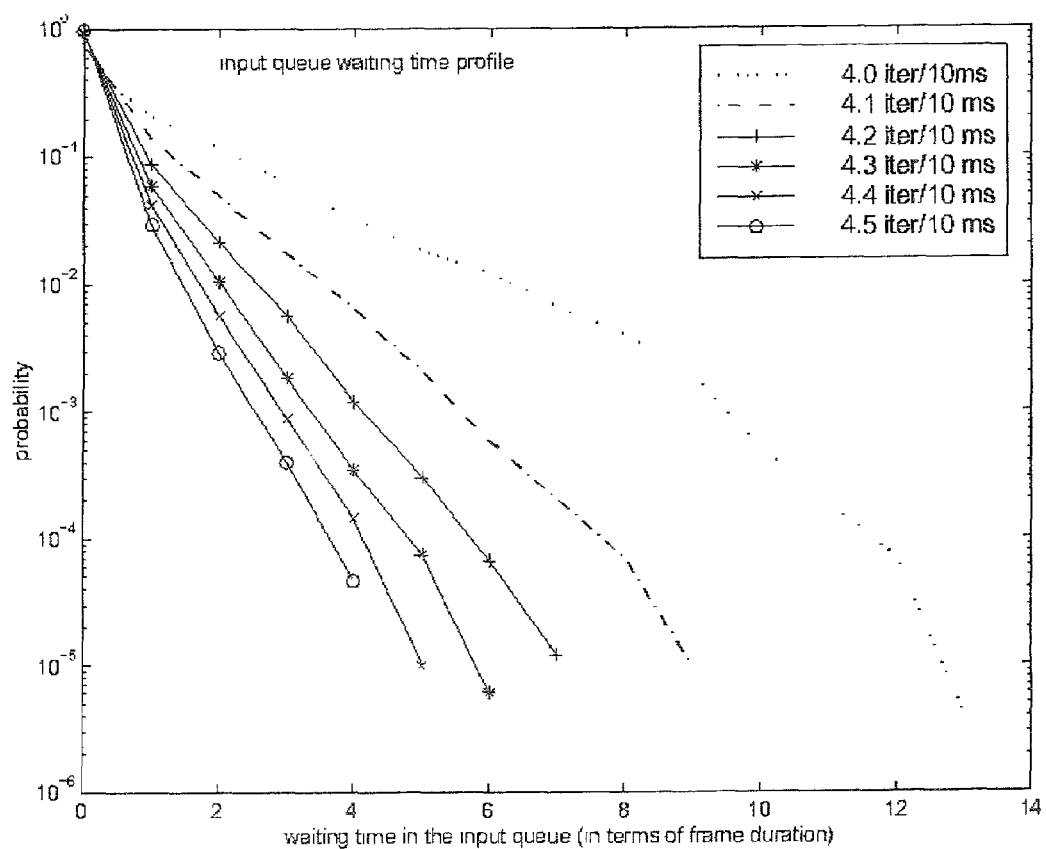
FIG. 14 depicts a plot for the input waiting time profile of the system of FIG. 3.

Pursuant to the example, FIG. 13 shows the maximum storage device or buffer length required for the same Fb at different processing speeds. FIG. 14 depicts a plot for the input waiting time profile. From this graph, one can see that for a decoder speed of 4 iterations per 10 ms, the waiting time probability for a 13 frame duration is 5.0e-06. If the maximum input storage device or buffer size is maintained as the profile shown in FIG. 13, the storage device or buffer drop profile will be the profile shown in FIG. 15.

Figure 16:
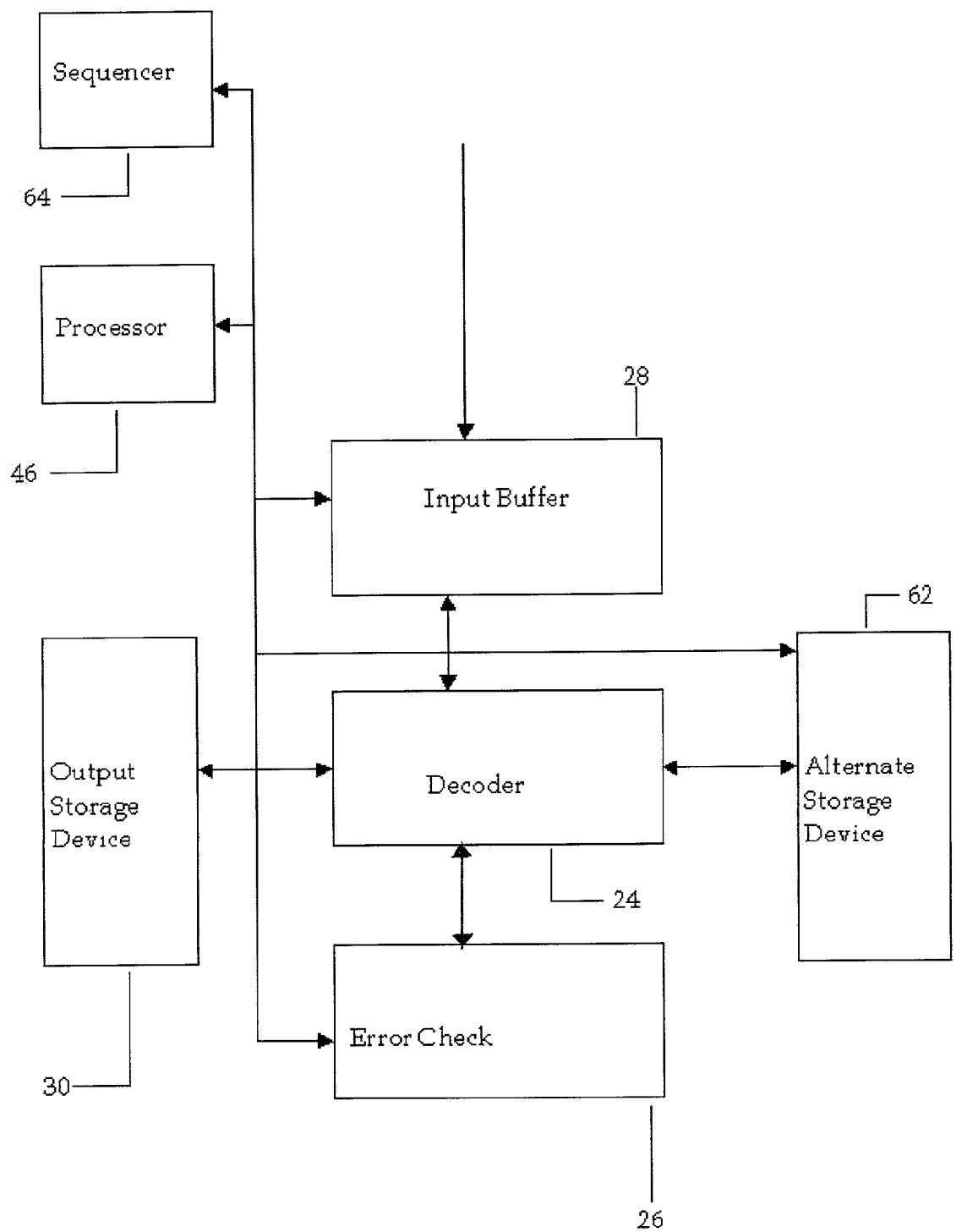
FIG. 16 depicts a block diagram of yet another configuration of receiver components of the system of FIG. 3 pursuant to aspects of the invention.

Pursuant to a third aspect of the invention, frames are decoded and processed out of sequence depending on the number of iterations required to decode the frames. This desirably prevents frames that require a greater number of decoding iterations to reach substantial convergence from stopping other frames that require less decoding iterations from being decoded. A third configuration of receiver components pursuant to the third aspect of the invention is shown in FIG. 16. Note that although an input storage device or buffer 28 is shown in FIG. 16, embodiments incorporating the third aspect of the invention need not include an input storage device or buffer.

Frames are decoded in the decoder 24 and are checked for errors by the error check 26 after a predetermined number of decoding iterations have been performed by the decoder. If an error is detected, the frames having errors are sent to the alternate storage device or alternate buffer 62 from the error check 26 for supplemental decoding at a subsequent time. During that time, frames that are received from a channel or frames previously received from the channel and stored or buffered in the input storage device or buffer 28 are decoded by the decoder 24. The subsequent time is typically when the decoder 24 is not receiving other frames from the channel or when the input storage device or buffer 28 has a predetermined amount of memory available. Frames stored or buffered in the alternate storage device or alternate buffer 62 are then sent to the decoder 24 for supplemental decoding out of sequence. Note that supplemental decoding refers to performing more decoding iterations after the predetermined number of iterations have been performed. The error check 26 rechecks, either iteratively after each supplemental decoding iteration or after a predetermined number of supplemental decoding iterations, for errors. If no error is detected, the frames are resequenced by a sequencer 64 and stored or buffered in the output storage device or output buffer 30. Note that the sequencer can resequence the frames in a variety of ways, for example, by using a look-up table that is based on a temporal frame reference.

It should be noted that, for the embodiment shown in FIG. 16, the processor 46 is what commands the transfer of frames from one block to another (for example, from the alternate buffer 62 to the decoder 24), and performs the decoding operations and error checks.

Figure 15:
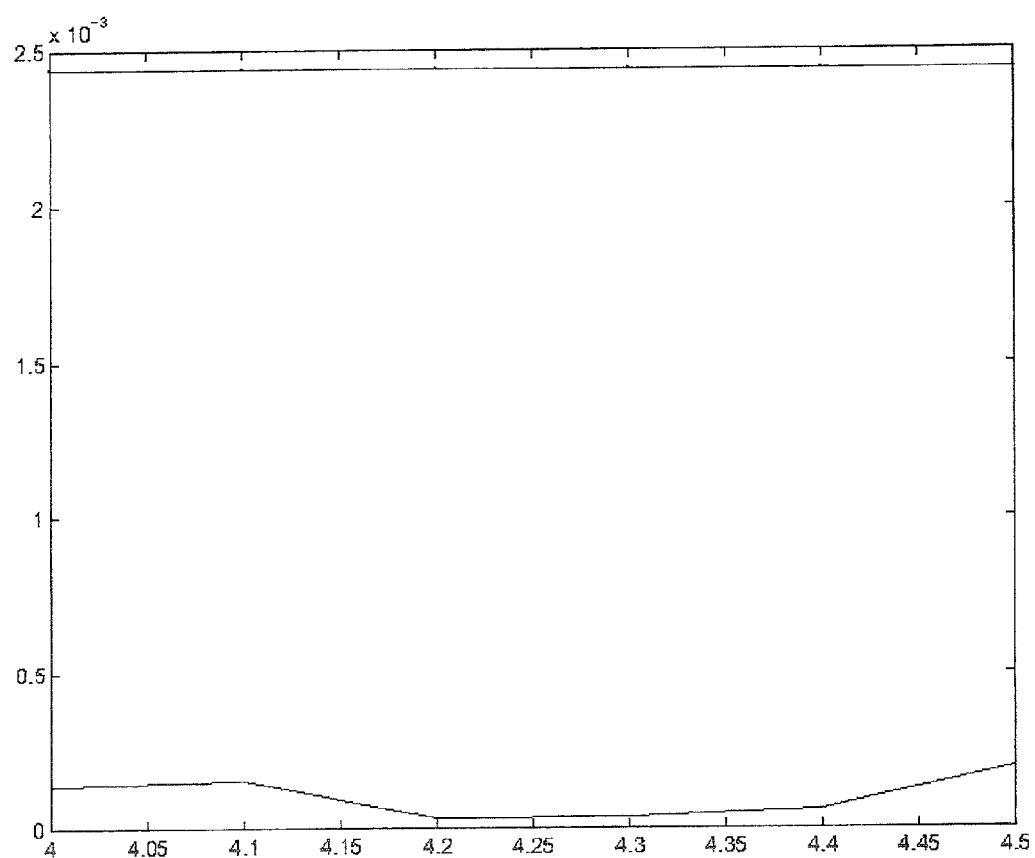
FIG. 15 depicts a buffer drop profile that will result if the maximum input buffer size is maintained as the profile shown in FIG. 13.

Pursuant to a fourth aspect of the invention, the decoded frames can be retrieved by an upper layer at a constant rate, or pursuant to any process or scheme whose average rate is equal to or less than the rate frames are decoded, even though the decoder decodes the frames at a variable rate. Decoded frames that, for example, are substantially converged, can be stored in the output buffer 30 and later sent to upper layers, as shown in FIGS. 3, 4, and 15. This allows for the output storage device or output buffer 30 to send the decoded frames to the upper layer at a constant rate, or pursuant to any process or scheme whose average rate is equal to or less than the rate frames are decoded, even though the frames are decoded at a variable rate. Note that an upper layer can be any information recovery process.

Note that, throughout the disclosure, the terms "stored" and "buffered" have been used in the alternative because the action to be performed can be either to "store" or to "buffer." Likewise, throughout the disclosure, the terms "storage device" and "buffer" have been used in the alternative because the component described can be either a "storage device" or a "buffer," based upon the frame tracking capabilities of an associated controller.

From the foregoing it will be observed that numerous modifications and variations can be effectuated without departing from the true spirit and scope of the novel concepts of the invention. It is to be understood that no limitation with respect to the embodiments illustrated is intended or should be inferred.

What is claimed is:

1. A method of decoding a sequence of frames in a communication system having a predetermined decoding time constraint per frame, such method comprising:
   iteratively decoding a first frame of the sequence of frames for a time period longer than the predetermined time constraint; and
   iteratively decoding at least one other frame of the sequence of frames by less than the predetermined time constraint so that an average decoding time of all decoded frames is less than or equal to the predetermined time constraint;
   storing at least one frame of the sequence of frames in an input storage device; and
   determining an input storage device length for reducing input storage frame overflow;
   wherein the step of determining the input storage device length is based on the following equation:

$$Fb=1-\Sigma_{i=0 \text{ to } L}Pr(b=i)$$

L being the input storage device length, Fb being the Frame Error Rate caused from input storage device frame overflow, Fe being a known Frame Error Rate caused from error, Ft being the total Frame Error Rate caused by the sum of Fe and Fb, PF being a predetermined precision factor, and Fb<(Fe/(PF)).

2. The method of claim 1 wherein a maximum a posteriori method is used to decode.

3. The method of claim 1 wherein a soft output Viterbi method is used to decode.

4. The method of claim 1 further comprising storing at least one decoded frame in an output storage device.

5. A method of decoding a sequence of frames in a communication system, such method comprising:
   iteratively decoding the frames of the sequence of frames at a variable time rate, at least one frame of the sequence of frames being decoded within a time period that is less than a time constraint of the communication system,
   checking the frames of the sequence for errors;
   selectively storing frames of the sequence of frames in an alternate storage device for supplementary decoding the stored frames out of sequence;
   rechecking the stored frames for errors;
   selectively resequencing the stored frames based on the error recheck;

using a look-up table to resequence the frames processed out of sequence; and outputting the decoded frames of the sequence of frames to an upper layer at a constant rate.

6. The method of claim 5 further comprising the step of storing the decoded frames.

7. The method of claim 6 wherein the decoded frames are stored in an output storage device.

8. A method of decoding a sequence of frames in a communication system, such method comprising:

determining a storage device length to reduce input storage device frame overflow based on the following equation: $Fb=1-\Sigma_{i=0 \ to \ L} Pr(b=i)$, L being the input storage device length, Fb being the Frame Error Rate caused from input storage device frame overflow, Fe being a known Frame Error Rate caused from error, Ft being the total Frame Error Rate caused from Fe and Fb combined, PF being a predetermined precision factor, and $Fb<(Fe/(PF))$;

setting the input storage device to the determined length;

storing at least one frame of the sequence of frames in the input storage device; and, iteratively decoding at least one frame of the sequence of frames.

9. An apparatus for decoding a sequence of frames in a communication system having a predetermined decoding time constraint per frame, such apparatus comprising:

a means for iteratively decoding a first frame of the sequence of frames for a time period longer than the predetermined decoding time constraint;

a means for iteratively decoding at least one other frame of the sequence of frames in less than or equal to the predetermined decoding time constraint; and, a means for storing the at least one other frame while the first frame is decoded for longer than the predetermined decoding time constraint, and wherein the average decoding time of all decoded frames is less than or equal to the predetermined decoding time constraint, wherein the length of the means for storing is based on the following equation:

$$Fb=1-\Sigma_{i=0 \ to \ L} Pr(b=i)$$

L being the input storage device length, Fb being the Frame Error Rate caused from input storage device frame overflow, Fe being a known Frame Error Rate caused from error, Ft being the total Frame Error Rate caused by the sum of Fe and Fb, PF being a predetermined precision factor, and $Fb<(Fe/(PF))$.

10. The apparatus of claim 9 further comprising a means for checking the frames of the sequence for errors.

11. The apparatus of claim 10 further comprising a means for selectively storing frames of the sequence of frames for supplemental decoding.

12. The apparatus of claim 9 further comprising a means for selectively storing decoded frames.

13. An apparatus for decoding a sequence of frames in a communication system having a predetermined decoding time constraint per frame, such apparatus comprising:

A decoder configured to iteratively decode a first frame of the sequence of frames for a time period longer than the predetermined decoding time constraint and configured to iteratively decode at least one other frame of the sequence of frames in less than or equal to the predetermined decoding time constraint, and an input storage device configured to store the at least one other frame while the first frame is decoded for longer than the predetermined decoding time constraint, the input storage device coupled to the decoder, wherein the average decoding time of all decoded frames is less than or equal to the predetermined time period, wherein the length of the input storage device is based on the following equation:

$$Fb=1-\Sigma_{i=0 \ to \ L} Pr(b=i)$$

L being the input storage device length, Fb being the Frame Error Rate caused from input storage device frame overflow, Fe being a known Frame Error Rate caused from error, Ft being the total Frame Error Rate caused by the sum of Fe and Fb, PF being a predetermined precision factor, and $Fb<(Fe/(PF))$.

14. The apparatus of claim 13 further comprising an error check configured to check frames for errors, the error check coupled to the decoder.

15. The apparatus of claim 14 wherein the decoder and error check are a processor.

16. The apparatus of claim 14 further comprising an alternate storage device configured to store frames having detected errors, the alternate storage device coupled to the decoder.

17. The apparatus of claim 16 further comprising a sequencer for resequencing frames.

18. The apparatus of claim 17 wherein the sequencer and the decoder are a processor.

19. The apparatus of claim 13 further comprising an output storage device configured to store decoded frames, the output storage device coupled to the decoder.

20. The apparatus of claim 13 wherein the decoder is a processor.

21. A method of decoding a sequence of frames in a communication system having a predetermined decoding time constraint per frame, such method comprising:

iteratively decoding a first frame of the sequence of frames for a time period longer than the predetermined time constraint;

iteratively decoding at least one other frame of the sequence of frames by less than the predetermined time constraint so that an average decoding time of all decoded frames is less than or equal to the predetermined time constraint;

checking the frames of the sequence for errors;

selectively storing frames of the sequence of frames in an alternate storage device for supplementary decoding the stored frames out of sequence;

rechecking the stored frames for errors;

selectively resequencing the stored frames based on the error recheck; and using a look-up table to resequence the frames processed out of sequence.

22. The method of claim 21 further comprising selectively storing the frames in an output storage device based on the error recheck.

23. The method of claim 21 further comprising selectively storing frames of the sequence of frames in an output storage device if the frames are free of detected errors.

24. The method of claim 21 wherein the frames are decoded by a processor having a decoding speed, and the frames are checked for errors after a preselected decoding time, the decoding time based on the decoding speed.

25. The method of claim 21 wherein the decoding of frames comprises performing decoding iterations, and wherein the frames are checked for errors after a preselected number of decoding iterations have been performed.

26. The method of claim 21 wherein the decoding of frames comprises performing decoding iterations, and wherein the frames are checked for errors after each decoding iteration has been performed.

27. The method of claim 21 wherein a Cyclic Redundancy Check is used to check for errors.

28. The method of claim 21 further comprising storing at least one frame of the sequence of frames in an input storage device.

29. The method of claim 21 further comprising terminating the decoding of frames based on the error check.

* * * * *